(12) United States Patent
Laquer et al.

(10) Patent No.: US 10,069,464 B1
(45) Date of Patent: Sep. 4, 2018

(54) 3D LOW FLUX, HIGH-POWERED MMIC AMPLIFIERS

(71) Applicant: The Boeing Company, Chicago, IL (US)

(72) Inventors: Andrew George Laquer, Tustin, CA (US); Dean L Araki, Redondo Beach, CA (US); Pohan Yang, Cypress, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/438,738

(22) Filed: Feb. 21, 2017

(51) Int. Cl.
| | |
|---|---|
| *H03F 1/14* | (2006.01) |
| *H03F 1/30* | (2006.01) |
| *H01L 29/20* | (2006.01) |
| *H01L 29/778* | (2006.01) |
| *H01L 29/205* | (2006.01) |
| *H01L 23/522* | (2006.01) |
| *H03F 3/195* | (2006.01) |
| *H03F 3/213* | (2006.01) |
| *H01L 23/66* | (2006.01) |
| *H01L 23/528* | (2006.01) |

(52) U.S. Cl.
CPC ............. *H03F 1/30* (2013.01); *H01L 23/528* (2013.01); *H01L 23/5226* (2013.01); *H01L 23/66* (2013.01); *H01L 29/2003* (2013.01); *H01L 29/205* (2013.01); *H01L 29/7787* (2013.01); *H03F 3/195* (2013.01); *H03F 3/213* (2013.01); *H01L 2223/6627* (2013.01); *H01L 2223/6644* (2013.01); *H01L 2223/6661* (2013.01); *H01L 2223/6683* (2013.01); *H03F 2200/447* (2013.01); *H03F 2200/451* (2013.01); *H03F 2200/543* (2013.01)

(58) Field of Classification Search
CPC ... H03F 3/60; H03F 3/602; H03F 3/68; H03F 3/195
USPC ......................................... 330/286, 295, 307
See application file for complete search history.

(56) References Cited

U.S. PATENT DOCUMENTS

| | | | | |
|---|---|---|---|---|
| 4,525,680 A | * | 6/1985 | Pan ......................... | H03F 3/601 330/277 |
| 5,485,118 A | * | 1/1996 | Chick ..................... | H03F 3/607 330/277 |
| 7,509,100 B2 | * | 3/2009 | Toncich ............. | G01R 27/2694 330/302 |

(Continued)

*Primary Examiner* — Steven J Mottola
(74) *Attorney, Agent, or Firm* — McDonnell Boehnen Hulbert & Berghoff LLP

(57) ABSTRACT

The present disclosure relates systems and methods for providing a three-dimensional device architecture for transistor elements in a power amplifier circuit. Namely, an example system may include a plurality of high electron mobility transistors disposed on a first substrate. A first portion of the plurality of high electron mobility transistors are electrically coupled via respective first level interconnects disposed on the first substrate. The system also includes a plurality of second level interconnects disposed on a second substrate. A second portion of the plurality of high electron mobility transistors are electrically coupled via respective second level interconnects. The first substrate and the second substrate are coupled such that the plurality of high electron mobility transistors provides an amplified output signal via at least one of the first level interconnects or the second level interconnects.

21 Claims, 9 Drawing Sheets

(56) References Cited

U.S. PATENT DOCUMENTS

| | | |
|---|---|---|
| 9,087,854 B1 | 7/2015 | Ha et al. |
| 9,368,854 B2 | 6/2016 | Lopez et al. |
| 2009/0039966 A1* | 2/2009 | Chow .................... H01L 23/66 |
| | | 330/307 |

* cited by examiner

Overhead Silicon
Distribution Level

US 10,069,464 B1

3D LOW FLUX, HIGH-POWERED MMIC AMPLIFIERS

FIELD

The present disclosure generally relates to three-dimensional arrangements of transistor circuits in a power amplifier system. Namely, the transistor circuits and at least some of the interconnect elements may be distributed on different substrates. As such, some conventional design constraints may be relaxed so as to provide more compact and higher performance amplifier systems.

BACKGROUND

In conventional RF power amplifiers, the output is thermally limited by the proximity of transistors with respect to one another, the heat that the transistors dissipate, and the available cooling capability. In particular, linear binomial feed and combiner amplifier network arrangements place last stage transistors close to one another. Such arrangements concentrate a thermal load and increase the heat flux in a given area/volume. Linear binomial feed and combiner arrangements (e.g., binomial tree architectures) arise due to some foundry design rules, such as prohibiting cross-over of feed and combiner conductors.

SUMMARY

In an aspect, a system is described. The system includes a plurality of high electron mobility transistors disposed on a first substrate. The plurality of high electron mobility transistors is configured to accept an input signal from an input and provide an output signal at an output. The output signal includes an amplified version of the input signal. A first portion of the plurality of high electron mobility transistors are electrically coupled via respective first level interconnects disposed on the first substrate. The system includes a plurality of second level interconnects disposed on a second substrate. A second portion of the plurality of high electron mobility transistors are electrically coupled via respective second level interconnects. The first substrate and the second substrate are coupled such that the plurality of high electron mobility transistors provides the output signal via at least one of the first level interconnects or the second level interconnects.

In a further aspect, a system is described. The system includes a plurality of high electron mobility transistors disposed on a first substrate. The plurality of high electron mobility transistors is configured to accept an input signal from an input and provide an output signal at an output. The output signal includes an amplified version of the input signal. A first portion of the plurality of high electron mobility transistors are electrically coupled via respective first level interconnects disposed on the first substrate. The system also includes a plurality of second level interconnects disposed on a second substrate. A second portion of the plurality of high electron mobility transistors are electrically coupled via respective second level interconnects. The first substrate and the second substrate are coupled such that the plurality of high electron mobility transistors provides the output signal via at least one of the first level interconnects or the second level interconnects. The first substrate and the second substrate include dissimilar materials. The plurality of high electron mobility transistors includes a plurality of amplifier stages. The first level interconnects include microstrip conductors and the second level interconnects include stripline conductors. The input signal includes a microwave signal. The microwave signal includes at least one frequency within a frequency range between 26.5 GHz and 40 GHz. The system dissipates at least 20 watts of electrical power.

In another aspect, a method is described. The method includes determining a distributed spatial arrangement of a plurality of high electron mobility transistors disposed on a first substrate. The plurality of high electron mobility transistors includes gallium nitride (GaN) transistors. The plurality of high electron mobility transistors is configured to accept an input signal from an input and provide an output signal at an output. The output signal includes an amplified version of the input signal. The method also includes determining an arrangement of first level interconnects disposed on the first substrate. A first portion of the plurality of high electron mobility transistors are electrically coupled via respective first level interconnects. The method also includes determining an arrangement of a plurality of second level interconnects disposed on a second substrate. The method yet further includes coupling the first substrate and the second substrate such that a second portion of the plurality of high electron mobility transistors are electrically coupled via respective second level interconnects. The first substrate and the second substrate include different materials. The first substrate includes an epitaxial GaN-compatible substrate. The second substrate includes silicon. The method also includes operating the plurality of high electron mobility transistors such that the plurality of high electron mobility transistors provides the output signal via at least one of the first level interconnects or the second level interconnects.

Other aspects, examples, and implementations will become apparent to those of ordinary skill in the art by reading the following detailed description with reference, where appropriate, to the accompanying drawings.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying drawings, wherein:

DETAILED DESCRIPTION

Figure 1A:
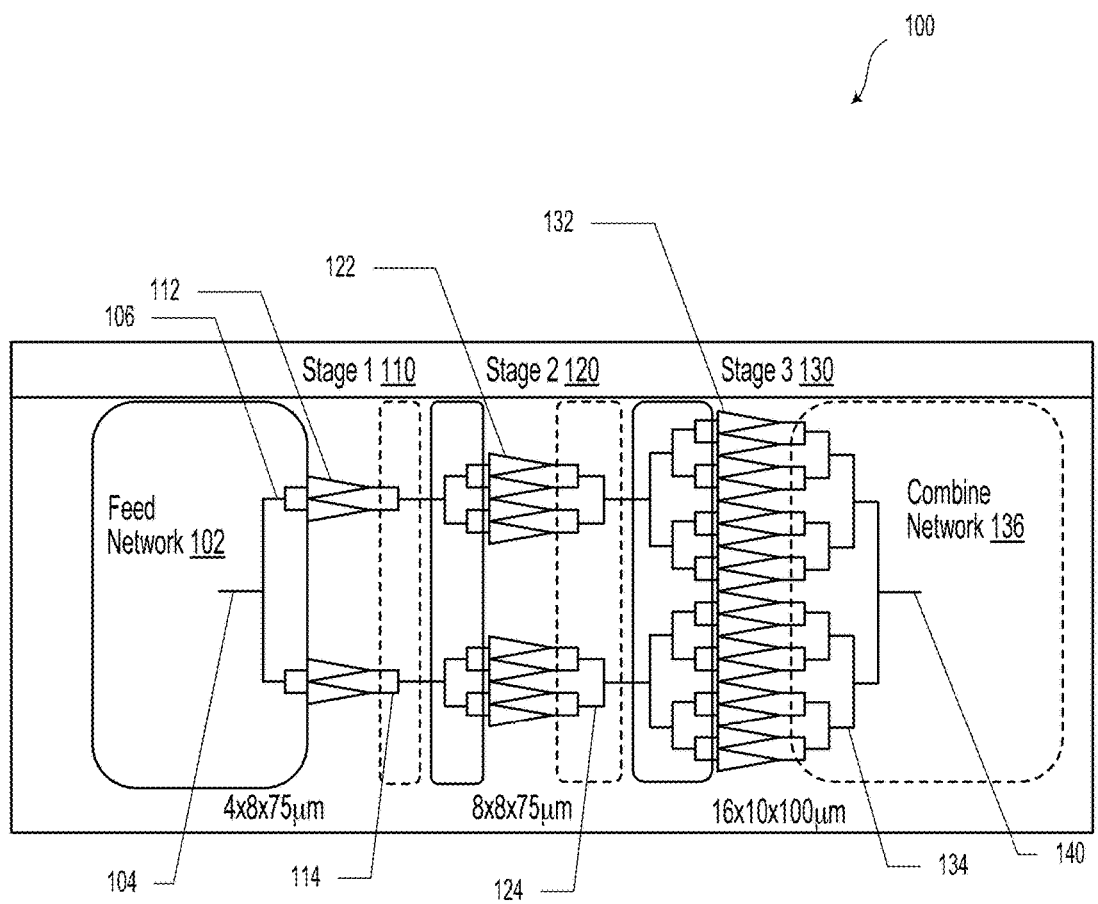
FIG. 1A illustrates a system, according to an example implementation.

Example methods, devices, and systems are described herein. It should be understood that the words "example"

and "exemplary" are used herein to mean "serving as an example, instance, or illustration." Any example or feature described herein as being an "example" or "exemplary" is not necessarily to be construed as preferred or advantageous over other examples or features. Other examples can be utilized, and other changes can be made, without departing from the scope of the subject matter presented herein.

Thus, the examples described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall examples, with the understanding that not all illustrated features are necessary for each example.

Systems and methods described herein include a three-dimensional (3D) architecture that involves two substrates and allows larger spacing between transistors, particularly between second and third stage amplifier transistors. In some examples, gallium nitride (GaN) high electron mobility transistors (HEMTs) may be disposed on a first substrate, which may include a GaN epitaxy-compatible material. A first portion of the transistors may be coupled via a plurality of first level interconnects. In an example, the system may include three amplification stages and the first level interconnects may couple the first and second stage amplifier circuits together and provide coupling between the third stage amplifier circuits and the output.

A plurality of second level interconnects may be disposed on a second substrate. In an example, the second level interconnects may couple the input from the first substrate to the first stage amplifier circuits. Additionally or alternatively, the second level interconnects may couple the second and third stage amplifier circuits.

Some design parameters may include maintaining equal electrical path lengths to maintain phase coherence within the amplifier. The power amplifier field effect transistors (FETs) are placed on GaN substrate while maintaining equal input and output path lengths. The FETs do not need to be in a straight line with close pitch. In some examples, a silicon wafer with distribution network is attached to GaN wafer with the use of copper pillars to interconnect the conductors on the two substrates. Such a 3D layout allows the distribution and combining RF transmission lines to crossover one another using the $3^{rd}$ dimension while minimizing "cross talk" between feed/combiner lines.

In some examples, 3D routing of the distribution network may provide that the transistors may be evenly distributed (spaced out) over the two-dimensional GaN surface rather than being compressed into a straight line (as in a linear binomial arrangement). Such arrangements reduce the heat flux and operating temperature for a given amplification scenario.

The systems and methods described herein may provide better performance for amplifiers for RF (e.g., radar and satellite communications), embedded computing (e.g., processors, graphics cards, flight computers), and solid state lasers (e.g., laser diode bars). For example, the described 3D arrangements may enable GaN power amplifiers to operate at lower temperature for a given power output and/or generate more power per unit area than conventional linear binomial arrangements.

FIG. 1A illustrates a system 100. System 100 may be operated as a radio frequency (RF) power amplifier. Namely, system 100 may be a multiple stage amplifier, which may include a first stage 110, a second stage 120, and a third stage 130. System 100 may accept an input signal at input 104. The input signal may be distributed to a plurality of first stage amplifiers 112 via a feed network 102, which may include a first plurality of branching electrical conductors 106. As described herein, the feed network 102 could include electrical conductors and/or other types of signal transmission elements configured to distribute a signal among several further amplifier elements.

The output of the first stage amplifiers 112 may be combined and fed to a plurality of second stage amplifiers 122 via a second plurality of branching electrical conductors 114.

The output of the second stage amplifiers 122 may be combined and fed to a plurality of third stage amplifiers 132 via a third plurality of branching electrical conductors 124. The output of the third stage amplifiers 132 may be combined via the combine network 136, which may include a fourth plurality of branching electrical conductors 134. The combined output signal may be provided to output 140. Such an arrangement of amplifiers, and feed/combine networks may be termed a linear binomial amplifier (or binomial tree) arrangements. As described herein, the combine network 136 could include electrical conductors and/or other types of signal transmission elements configured to combine multiple signals to provide a single signal.

In some RF power amplifiers like system 100, system performance may be limited due to thermal constraints. For example, due to the proximity of first, second, and third stage amplifiers and corresponding transistors with respect to one another, heat may build up in specific areas and/or volumes in the supporting substrate. In particular, the dense, linear arrangement of the third stage amplifiers 132 concentrate a thermal load and increase the heat flux in an area/volume that is relatively small compared to the overall footprint of the system 100.

Figure 1B:
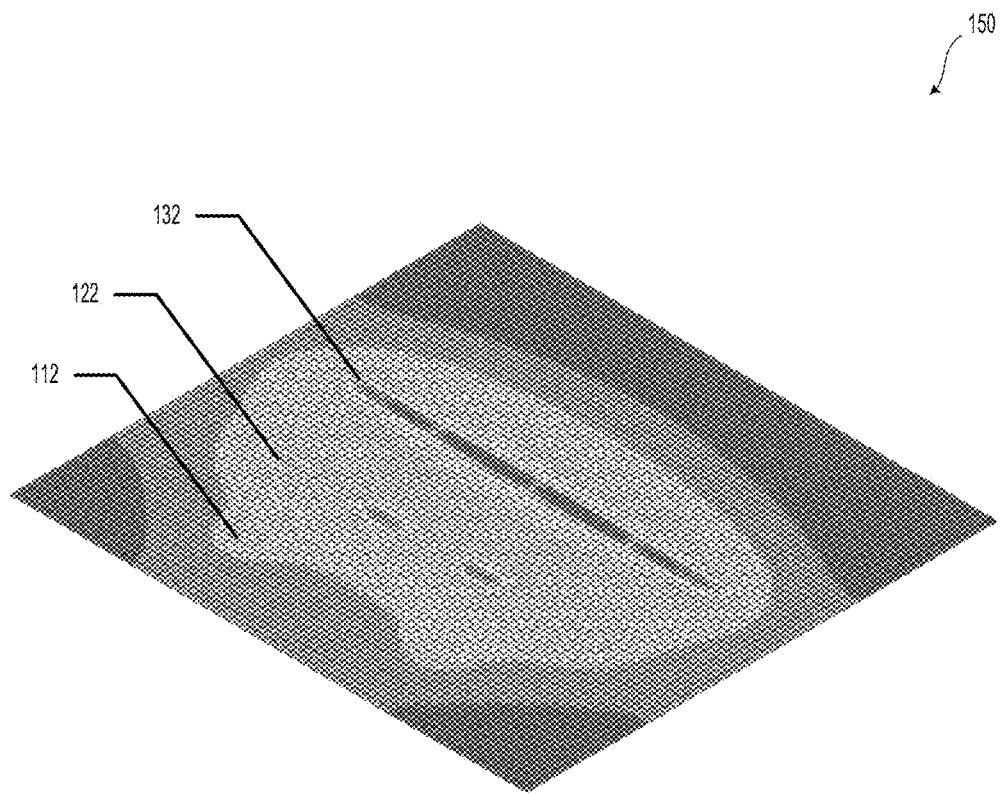
FIG. 1B illustrates a thermal plot, according to an example implementation.

FIG. 1B illustrates a thermal plot 150 during operation of a multi-stage amplifier system, which may be similar to system 100. Namely, the thermal plot 150 illustrates higher temperature regions near the first stage amplifiers 112, second stage amplifiers 122, and third stage amplifiers 132. In other words, the thermal plot 150 indicates that, for some RF power amplifier designs, the heat distribution is not homogeneous within the substrate, and that heat is concentrated in areas where the transistor-based amplifiers are closest.

Figure 2:
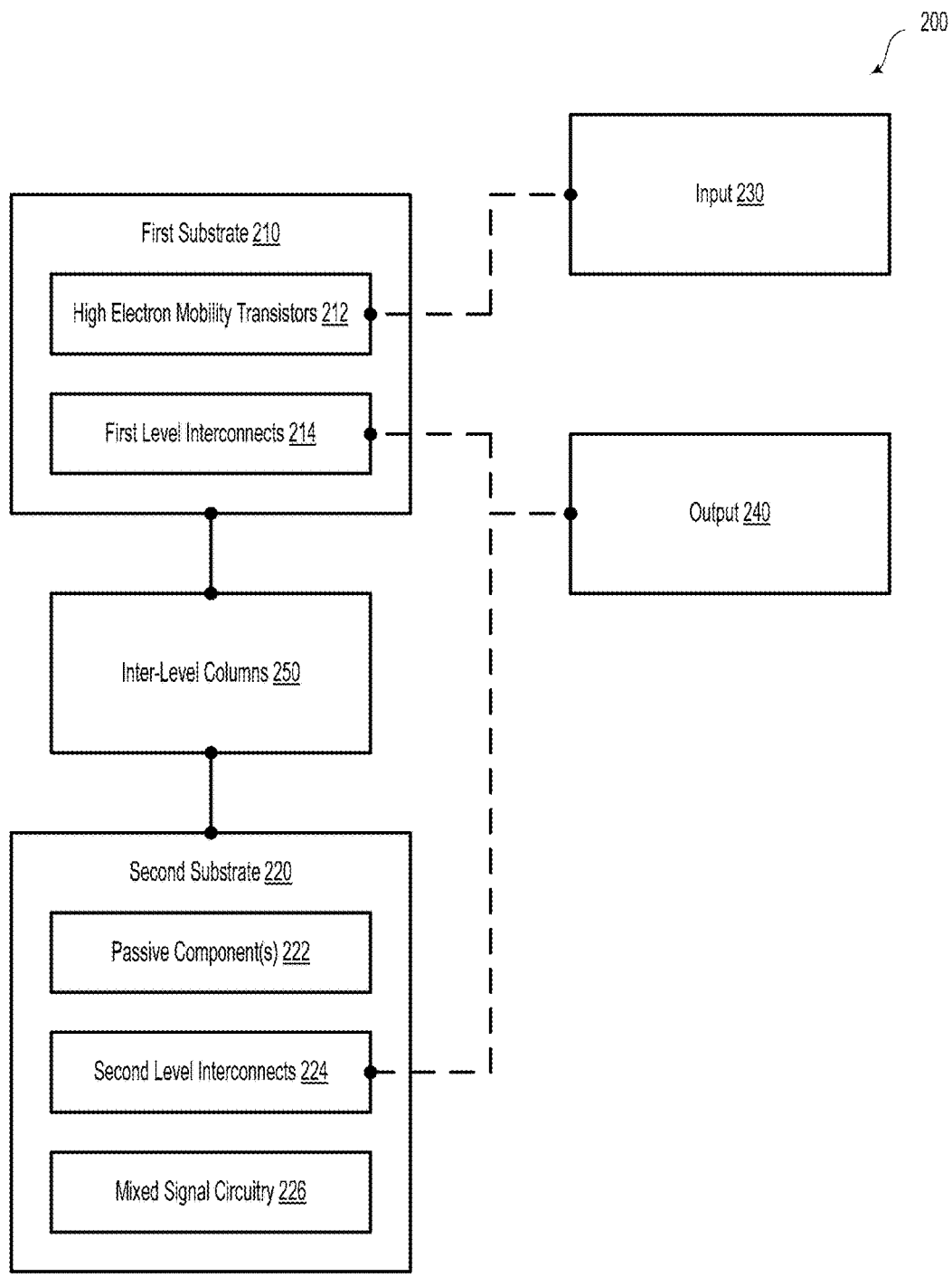
FIG. 2 illustrates a system, according to an example implementation.

FIG. 2 illustrates a system 200, according to another example implementation. System 200 includes a plurality of high electron mobility transistors 212 disposed on a first substrate 210. The plurality of high electron mobility transistors 212 is configured to accept an input signal from an input 230 and provide an output signal at an output 240. The output signal includes an amplified version of the input signal. A first portion of the plurality of high electron mobility transistors 212 are electrically coupled to one another via respective first level interconnects 214 disposed on the first substrate 210. In an example embodiment, the first portion of the plurality of high electron mobility transistors 212 may include transistors corresponding to a first amplifier stage and/or a second amplifier stage.

In an example, the input signal may include a microwave signal. For instance, the microwave signal may include at least one frequency within a frequency range between 26.5 GHz and 40 GHz (e.g., the KA microwave band). It will be understood that other microwave frequency ranges are possible and contemplated herein. Additionally or alternatively, signals within other frequency ranges are possible.

The system 200 also includes a plurality of second level interconnects 224 disposed on a second substrate 220. A second portion of the plurality of high electron mobility transistors 212 are electrically coupled to each other via respective second level interconnects 224. In an example embodiment, the second portion of the plurality of high electron mobility transistors 212 may include transistors corresponding to the first amplifier stage, the second amplifier stage, and/or a third amplifier stage. The first substrate 210 and the second substrate 220 are coupled such that the plurality of high electron mobility transistors 212 provides the output signal via at least one of the first level interconnects 214 or the second level interconnects 224.

In some examples, the plurality of high electron mobility transistors 212 may be arranged in a multiple stage amplifier configuration. For example, the plurality of high electron mobility transistors 212 may include a first amplifier stage, a second amplifier stage, and a third amplifier stage. More or fewer amplifier stages are contemplated with regard to the present disclosure.

The first substrate 210 and the second substrate 220 may include different materials. For example, the first substrate 210 may include an epitaxial GaN-compatible substrate. The plurality of high electron mobility transistors 212 may include gallium nitride (GaN) transistors. For instance, the GaN transistors may be formed from epitaxial GaN material deposited on the epitaxial GaN-compatible substrate. In some examples, the GaN-compatible substrate could include silicon carbide (SiC), gallium arsenide (GaAs), or silicon. In such scenarios, an epitaxial buffer or template layer may be provided on the substrate so as to provide a suitable growth surface for epitaxial GaN, which may be deposited using molecular beam epitaxy (MBE) or metal-organic chemical vapor deposition (MOCVD), among other growth methods. In other examples, the GaN-compatible substrate may have a coefficient of thermal expansion (CTE) that is similar or identical to that of the second substrate 220, so as to avoid thermal expansion mismatch between the hybridized substrates.

In still other examples, the high electron mobility transistors 212 may be oriented based on a lattice orientation of the epitaxial GaN material. For example, respective channels of the high electron mobility transistors 212 may be arranged in a given orientation to take advantage of anisotropic electron mobility values in the epitaxial GaN.

In a specific example, the second substrate 220 may include silicon. Additionally or alternatively, the second substrate 220 could be another type of rigid material, such as FR-4, high-temperature co-fired ceramic (HTCC), low-temperature co-fired ceramic (LTCC), a multi-layer substrate, or another type of printed circuit board material.

In some examples, each electrical path length of a plurality of given electrical path lengths between the input 230 and the output 240 through respective high electron mobility transistors 212 is a same path length.

The plurality of high electron mobility transistors 212 is disposed in a distributed spatial arrangement. For example, at least a portion of the distributed spatial arrangement may include an array. The array includes at least one of: a square array, a rectangular array, a triangular array, a hexagonal array, or a radial array. Furthermore, while symmetric arrangements are illustrated and described herein, it will be understood that asymmetric arrangements are additionally or alternatively possible.

The system 200 includes a plurality of inter-level columns 250. Namely, the second portion of the plurality of high electron mobility transistors may be electrically coupled to the second level interconnects 224 via the plurality of inter-level columns 250, which may be disposed between the first substrate 210 and the second substrate 220. In an example, the inter-level columns 250 may include posts bridging the two substrates. For example, the posts may be between 10 and 1000 microns in height, or more. The plurality of inter-level columns 250 may include a conductive material such as gold, tin, indium, copper, or aluminum. It will be understood that other conductive materials are possible and contemplated herein. In some embodiments, the inter-level columns 250 may be arranged so as to provide a radio frequency fence to improve isolation between respective signals. For example, the inter-level columns 250 may be arranged so as to act as a Faraday cage for an output stripline conductor, which may reduce interference, distortion, or signal loss.

In some examples, system 200 may include one or more passive components 222 disposed on the second substrate 220. In such scenarios, the passive component(s) 222 may include a capacitor, an inductor, and/or a resistor. The passive component(s) 222 can also include surface-mount type devices. Other types of passive components are contemplated.

In some examples, the second substrate 220 may include a first surface (e.g., a bottom side) facing the first substrate 210 and a second surface (e.g., a top surface), which is opposite the first surface. In such a scenario, the second level interconnects 224 may be disposed along the first surface of the second substrate 220. Additionally or alternatively, the second level interconnects 224 may be disposed (in full or in part) along the second surface of the second substrate 220.

In some examples, the output 240 may be disposed along the second surface of the second substrate 220. For example, the output 240 may be coupled to the plurality of high electron mobility transistors 212 by a through-wafer via configured to convey the output signal from the first surface to the second surface of the second substrate 220.

In some examples, system 200 may include mixed signal circuitry 226. For example, at least a portion of the mixed signal circuitry 226 may be disposed along the second surface of the second substrate 220. In such a scenario, the portion of the mixed signal circuitry 226 may be coupled to the plurality of high electron mobility transistors 212 by at least one through-wafer via configured to convey one or more signals from the first surface to the second surface of the second substrate 220. Additionally or alternatively, the mixed signal circuitry may be coupled to the high electron mobility transistors 212 by at least a portion of the plurality of inter-level columns 250. It will be understood that the mixed signal circuitry 226 may be located on other surfaces of the second substrate 220.

The mixed signal circuitry 226 may include, but are not limited to, a digital to analog converter (DAC), an analog to digital converter (ADC), a digital logic device, a temperature reference/compensation device, a bandgap reference device, digital memory, or other types of circuitry.

In some examples, the mixed signal circuitry 226 could include an interposer network. Such an interposer network may include one or more electrical pathways so as to route the RF signal (or other electrical signals) to provide compatibility with a socket-type connector. For example, the interposer network may act as an adapter to provide compatibility with a ball-grid array (BGA), a land-grid array (LGA), or another type of electrical and/or RF signal connector.

In an example, the first level interconnects 214 may include microstrip conductors and the second level interconnects 224 may include stripline conductors. In some embodiments, the stripline conductors may provide better radio frequency signal isolation than the microstrip conductors. In some embodiments, the first level interconnects 214 and/or the second level interconnects 224 could be formed from a conductive metal (e.g., aluminum or copper), which may be 25-40 mils (0.025-0.04 inches) thick. The thickness of the respective conductive metals could be based on a thickness of the GaN on the first substrate 210.

Additionally or alternatively, the first level interconnects 214 may include stripline conductors. Furthermore, in some embodiments, the second level interconnects 224 may include microstrip conductors. Yet further, the first level interconnects 214 and/or the second level interconnects 224 may include a combination of different interconnect types (e.g., stripline, microstrip, coaxial, triaxial, etc.).

In an example, a system 200 may include a plurality of high electron mobility transistors 212 disposed on a first substrate 210. In such a scenario, the plurality of high electron mobility transistors 212 may be configured to accept an input signal from an input 230 and provide an output signal at an output 240. The output signal includes an amplified version of the input signal. A first portion of the plurality of high electron mobility transistors 212 may be electrically coupled via respective first level interconnects 214 disposed on the first substrate 210. The system 200 may also include a plurality of second level interconnects 224 disposed on a second substrate 220. In such a scenario, a second portion of the plurality of high electron mobility transistors 212 may be electrically coupled via respective second level interconnects 224. In such a scenario, the first substrate 210 and the second substrate 220 are coupled such that the plurality of high electron mobility transistors 212 provides the output signal via at least one of the first level interconnects 214 or the second level interconnects 224.

In such a scenario, the first substrate 210 and the second substrate 220 include dissimilar materials. Furthermore, the plurality of high electron mobility transistors 212 includes a plurality of amplifier stages. In such an example, the first level interconnects 214 include microstrip conductors and the second level interconnects 224 stripline conductors. In some embodiments, the input signal includes a microwave signal. The microwave signal includes at least one frequency within a frequency range between 26.5 GHz and 40 GHz, and the system may be configured to operate with at least 20 watts of electrical power.

In some examples, a finite air gap may be provided between the first substrate 210 and the second substrate 220. Such an air gap may provide some signal isolation between RF signals on the respective substrates.

As described elsewhere herein, system 200 may provide that each electrical path length of a plurality of given electrical path lengths between the input 230 and the output 240 through respective high electron mobility transistors 212 is a same path length.

While not illustrated herein, system 200 may include one or more temperature management devices. Such temperature management devices may include, but are not limited to, passive heatsinks, liquid cooling systems, heatpipes, or other types of devices configured to remove heat from the first substrate 210 and/or the second substrate 220. In other words, system 200 may include one or more heatsinks or other types of thermal management devices that are thermally-coupled to the first substrate 210 and/or the second substrate 220.

Figure 3A:
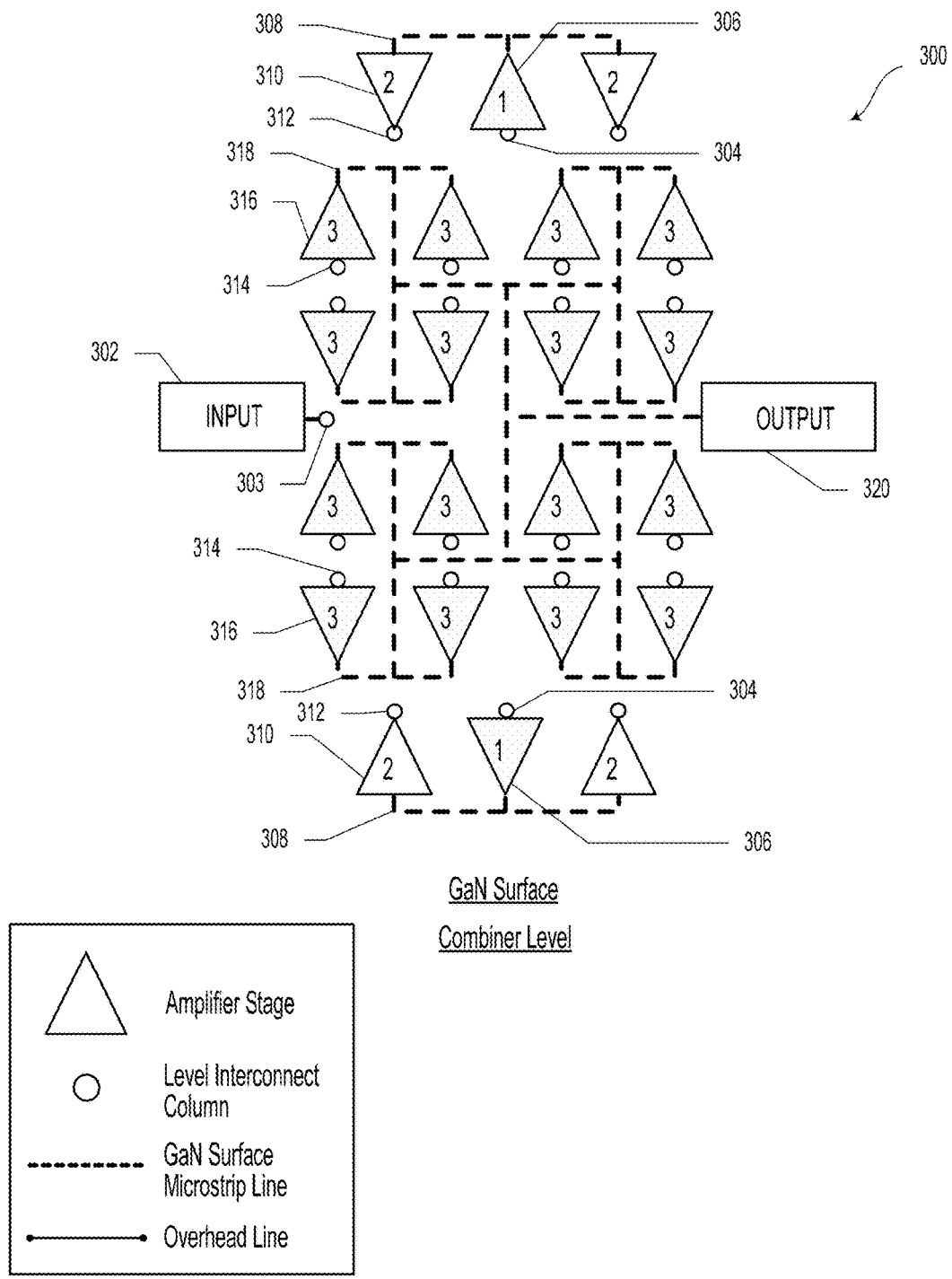
FIG. 3A illustrates a portion of a system, according to an example implementation.
Figure 3B:
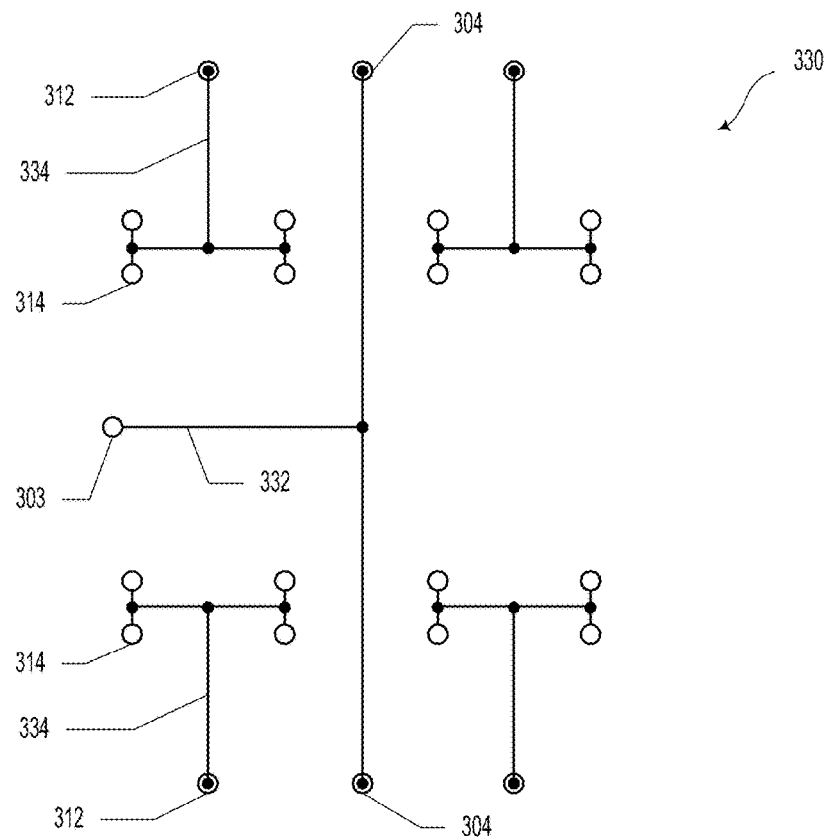
FIG. 3B illustrates a portion of a system, according to an example implementation.
Figure 3B:
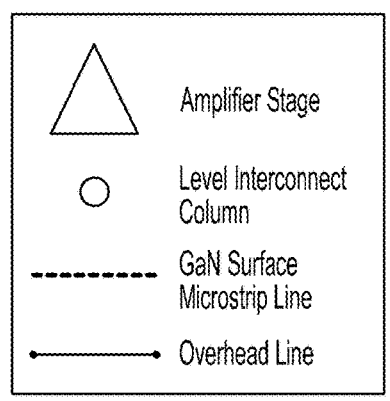
Figure 3C:
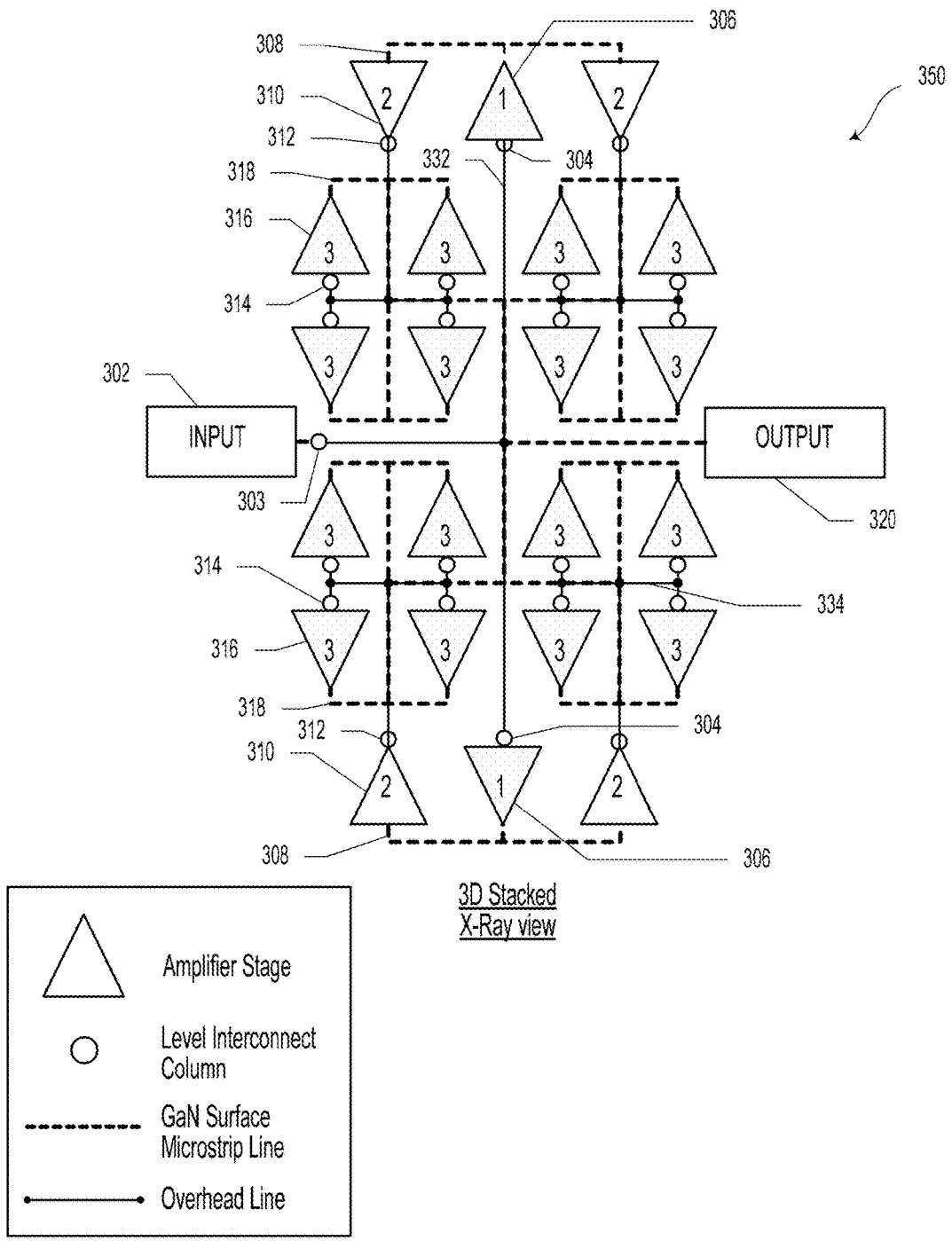
FIG. 3C illustrates a system, according to an example implementation.

FIGS. 3A, 3B, and 3C illustrate various systems 300, 330, and 350, according to an example implementation. Portions of systems 300, 330, and 350, taken individually or in combination, may be similar or identical to corresponding elements of system 200 as described in reference to FIG. 2. FIG. 3A illustrates a portion of a system 300, according to an example. Namely, FIG. 3A may describe elements coupled to the first substrate 210. FIG. 3B illustrates a portion of a system 330, according to an example. FIG. 3B may describe elements coupled to the second substrate 220.

In example implementations, the first amplifier stage may include two first stage transistor circuits 306. In such a scenario, the input signal may be provided at an input 302. The input signal may be transmitted to the second substrate 220 via at least one inter-level column 303. The input signal may be split or distributed among the two first stage transistor circuits 306 via a T-shaped second level interconnect 332 (shown in FIG. 3B) and further inter-level columns 304. An electrical path length along the T-shaped second level interconnect 332 is equal between the input 302 and the respective endpoints of the second level interconnect (e.g., at inter-level columns 304).

In some examples, the second amplifier stage may include four second stage transistor circuits 310. Respective outputs of the two first stage transistor circuits 306 may be coupled (e.g., connected and/or distributed) among the four second stage transistor circuits 310 via respective T-shaped first level interconnects 308. A given electrical path length along the respective T-shaped first level interconnects 308 is equal between the respective outputs of the two first stage transistor circuits 306 and respective endpoints of the first or second level interconnects.

Furthermore, the third amplifier stage may include sixteen third stage transistor circuits 316. In such a scenario, respective outputs of the four second stage transistor circuits 310 are split between the sixteen third stage transistor circuits 316 via respective Double-T-shaped second level interconnects 334 and inter-level columns 314 and 312. A given electrical path length along the respective Double-T-shaped second level interconnects 334 is equal between the respective outputs of the four second stage transistor circuits 310 and respective endpoints of the first or second level interconnects.

In some examples, respective outputs of the sixteen third stage transistor circuits 316 are coupled to the output via a Quadruple-T-shaped first level interconnect 318. A given electrical path length along the Quadruple-T-shaped first level interconnect 318 is equal between the respective outputs of the sixteen third stage transistor circuits 316 and the output 320.

System 300 and system 330 may be coupled to provide a three-dimensional multi-stage RF amplifier. As an example, FIG. 3C illustrates a system 350, according to an example implementation. System 350 may include an "x-ray" view of a combination of system 300 and system 330. While FIGS. 3A, 3B, and 3C illustrate a certain configuration of amplifiers and conductors, it will be understood that other configurations are possible and contemplated herein. For example, the first level interconnects need not overlap the second level interconnects.

Figure 4:
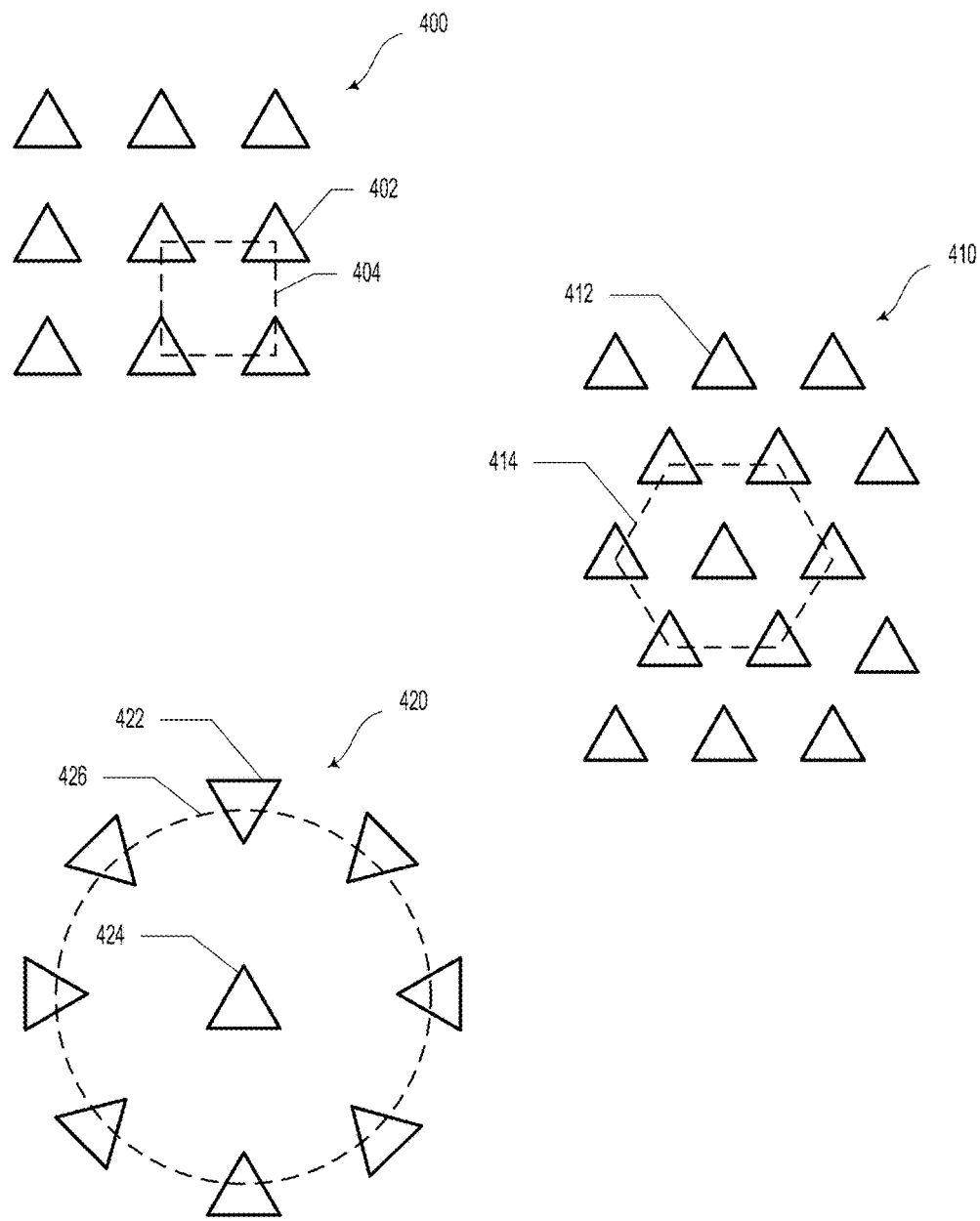
FIG. 4 illustrates various transistor circuit arrangements, according to example implementations.

FIG. 4 illustrates various transistor circuit arrangements 400, 410, and 420, according to example implementations. As described herein, the plurality of high electron mobility transistors may be disposed in a distributed spatial arrangement. For example, at least a portion of the high electron mobility transistors may be disposed in an array. For example, one possible transistor circuit arrangement 400 may include transistor circuits 402 disposed in a square array 404. While transistor circuit arrangement 400 includes a square array 404, it will be understood that rectangular arrays are also contemplated.

Additionally or alternatively, transistor circuit arrangement 410 may include at least a portion of the high electron mobility transistors (e.g., transistor circuits 412) being disposed in a hexagonal array 414. Yet further, transistor circuit arrangement 420 may include at least a portion of the high electron mobility transistors (e.g., transistor circuits 422) being disposed in a radial array 426 about one or more central transistor circuits 424. While the transistor circuits 422 are illustrated as having various orientations with respect to the one or more central transistor circuits 424, it will be understood that the transistor circuits 422 may be oriented in other ways. For example, the transistor circuits 422 may be oriented based on a crystal lattice of the GaN material.

Figure 5:
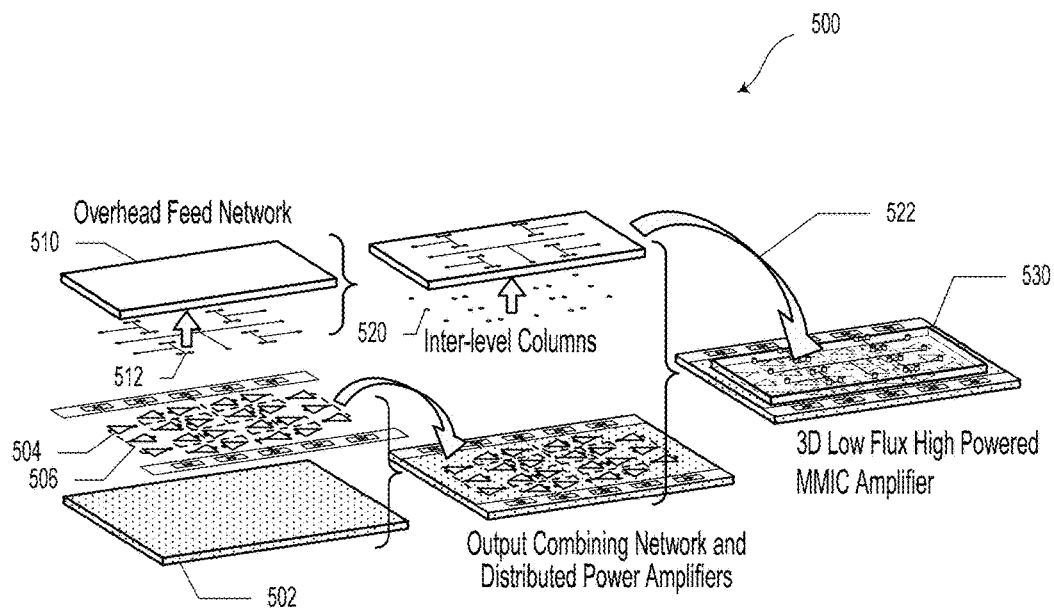
FIG. 5 illustrates a method, according to an example implementation.

FIG. 5 illustrates a schematic flow diagram of a method 500, according to an example implementation. Method 500 may involve elements of systems 200, 300, 330, and 350 as illustrated and described in reference to FIGS. 2, 3A, 3B, and 3C. While FIG. 5 illustrates certain blocks or steps carried out in a certain order, it is understood that some blocks or steps could be omitted and that other blocks or steps could be included. Furthermore, the blocks or steps could be carried out in a different order.

For example, a plurality of high electron mobility transistors 504 and an arrangement of first level interconnects 506 may be patterned and deposited, or otherwise formed on a first substrate 502. A lithography process (e.g., ultraviolet contact mask lithography) may be used to pattern photoresist on the first substrate 502. Subsequently, the photoresist may be developed and a metal pattern may be deposited on the first substrate 502. Such a metal pattern may provide one or more contacts for the plurality of high electron mobility transistors 504 and/or at least a portion of the arrangement of first level interconnects 506. Other semiconductor fabrication techniques are contemplated herein to form both the plurality of high electron mobility transistors 504 and the arrangement of first level interconnects 506.

Furthermore, an arrangement of second level interconnects 512 may be patterned and deposited, or otherwise formed on a second substrate 510. An arrangement of inter-level columns 520 may be patterned and deposited, or otherwise formed on the second substrate 510 and/or the first substrate 502. Furthermore, the first substrate 502 and the second substrate 510 may be coupled via the inter-level columns 520. For example, the first substrate 502 and the second substrate 510 may be bonded or otherwise hybridized together using, for example, a hybridization process 522. In some embodiments, the hybridization process 522 may include a bump-bonding process, a flip chip bonding process, a wafer bonding process, or a wafer fusion process. It will be understood that other ways to intimately join two different substrates are contemplated herein.

In an example, the hybridized chip 530 may include a three-dimensional distributed thermal flux RF power amplifier, which may be similar or identical to systems 200, 300, 330, and 350 as illustrated and described in reference to FIGS. 2, 3A, 3B, and 3C. In an example embodiment, the hybridized chip 530 may be thermally-coupled to one or more heatsinks or another type of thermal management device. That is, the one or more heatsinks could, for example, be thermally-coupled to the first substrate 502 and/or the second substrate 510.

Figure 6:
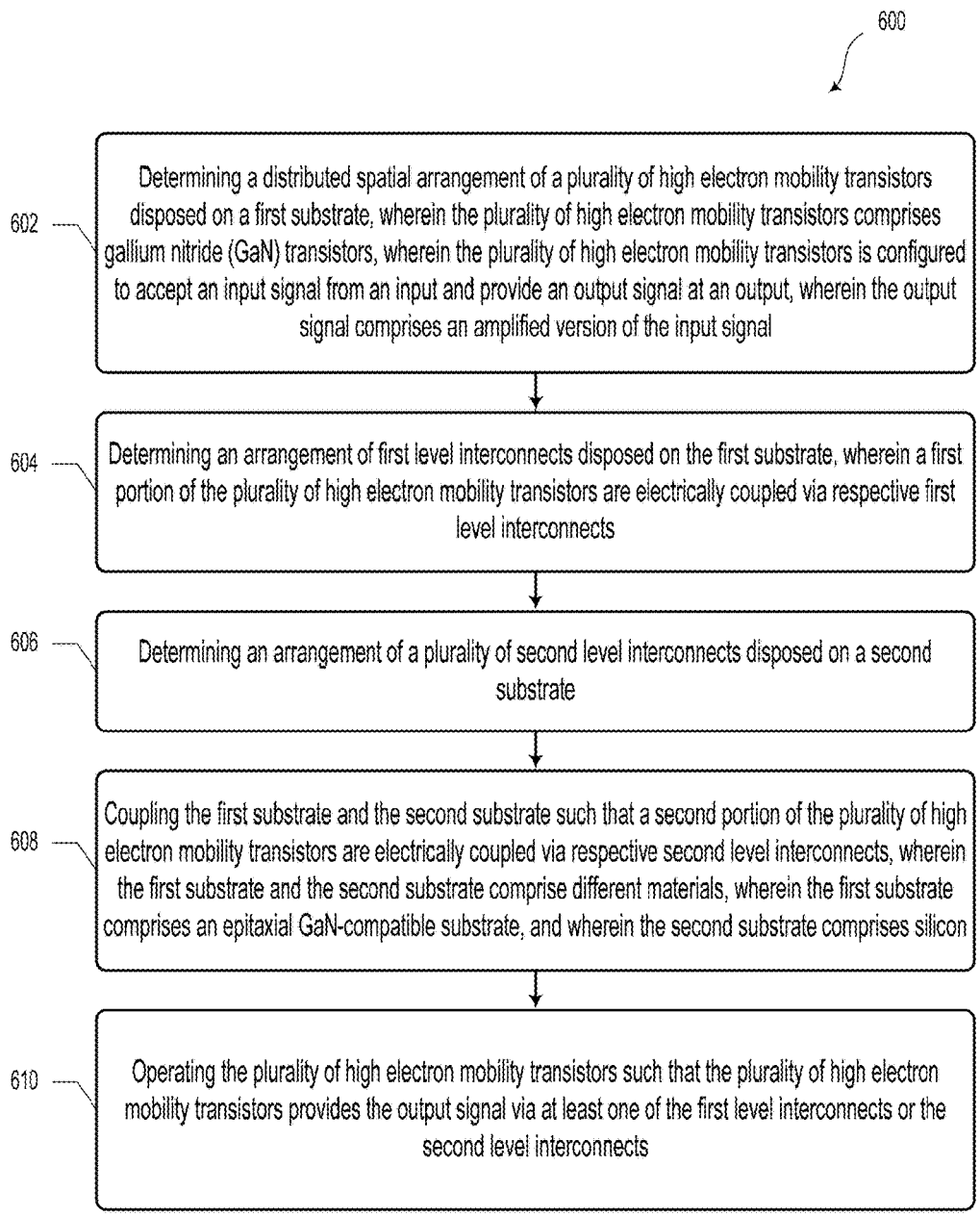
FIG. 6 illustrates a method, according to an example implementation.

FIG. 6 illustrates a method 600, according to an example implementation. While FIG. 6 illustrates certain blocks or steps carried out in a particular order, it is understood that some blocks or steps could be omitted and that other blocks or steps could be included. Furthermore, the blocks or steps could be carried out in a different order. The method 600 may include some or all of the elements of systems 200, 300, 330, and 350 as illustrated and described in reference to FIGS. 2, 3A, 3B, and 3C. Furthermore, the arrangement of high electron mobility transistors could include arrangements 400, 410, or 420 as illustrated and described in relation to FIG. 4.

Block 602 includes determining a distributed spatial arrangement of a plurality of high electron mobility transistors (e.g., high electron mobility transistors 212) disposed on a first substrate (e.g., first substrate 210). In an example, the plurality of high electron mobility transistors may include gallium nitride (GaN) transistors. The plurality of high electron mobility transistors is configured to accept an input signal from an input (e.g., input 230) and provide an output signal at an output (e.g., output 240). The output signal includes an amplified version of the input signal.

In an example, the input signal could include a microwave signal. That is, the microwave signal may include at least one frequency within a frequency range between 26.5 GHz and 40 GHz. However, other frequencies for the input signal are contemplated.

Block 604 includes determining an arrangement of first level interconnects (e.g., first level interconnects 214) disposed on the first substrate. A first portion of the plurality of high electron mobility transistors are electrically coupled via respective first level interconnects. In some embodiments, the first level interconnects may include microstrip conductors Block 606 includes determining an arrangement of a plurality of second level interconnects (e.g., second level interconnects 224) disposed on a second substrate (e.g., second substrate 220). In an example embodiment, the second level interconnects may include stripline conductors. It will be recognized that other types of interconnects are contemplated so as to properly conduct or propagate a radio frequency signal between amplifier stages without substantial signal loss, distortion, or interference.

In some examples, each electrical path length of a plurality of given electrical path lengths between the input and the output through respective high electron mobility transistors is a same path length. That is, the determination steps of blocks 602, 604, and 606 may be carried out under a preference, design rule, or constraint that the respective path lengths between input and output result in substantially the same length. For example, "substantially" the same length could mean that the respective path lengths are within 10%, 1%, 0.1% or less of a signal wavelength with respect to one another.

Block 608 includes coupling the first substrate and the second substrate such that a second portion of the plurality of high electron mobility transistors are electrically coupled via respective second level interconnects. The first substrate and the second substrate include different materials. The first substrate includes an epitaxial GaN-compatible substrate. The second substrate includes silicon. It will be understood that other materials are possible to comprise the first substrate and the second substrate.

As described elsewhere herein, the second portion of the plurality of high electron mobility transistors may be electrically coupled to the second level interconnects via a plurality of inter-level columns disposed between (e.g., bridging) the first substrate and the second substrate. The plurality of inter-level columns could include, for example, at least one of: indium, copper, or aluminum.

Furthermore, as described herein, a heatsink may be thermally-coupled to the first substrate and/or the second substrate. The heatsink may be configured to, for example, remove heat from the first substrate and/or the second substrate.

Block 610 includes operating the plurality of high electron mobility transistors such that the plurality of high electron mobility transistors provides the output signal via at least one of the first level interconnects or the second level interconnects. In some embodiments, the input signal may be amplified by utilizing at least 20 watts of power.

In some examples, the plurality of high electron mobility transistors may be disposed in a distributed spatial arrangement. That is, a portion of the distributed spatial arrangement may include an array. The array could include, for example, at least one of: a square array, a hexagonal array, or a radial array.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

The description of the different advantageous arrangements has been presented for purposes of illustration and description, and is not intended to be exhaustive or limited to the examples in the form disclosed. Many modifications and variations will be apparent to those of ordinary skill in the art. Further, different advantageous examples may describe different advantages as compared to other advantageous examples. The example or examples selected are chosen and described in order to best explain the principles of the examples, the practical application, and to enable others of ordinary skill in the art to understand the disclosure for various examples with various modifications as are suited to the particular use contemplated.

What is claimed is:

1. A system comprising:
a plurality of high electron mobility transistors disposed on a first substrate, wherein the plurality of high electron mobility transistors is configured to accept an input signal from an input and provide an output signal at an output, wherein the output signal comprises an amplified version of the input signal, wherein a first portion of the plurality of high electron mobility transistors are electrically coupled via respective first level interconnects disposed on the first substrate; and
a plurality of second level interconnects disposed on a second substrate, wherein the first substrate and the second substrate comprise different materials, wherein a second portion of the plurality of high electron mobility transistors are electrically coupled via respective second level interconnects, wherein the first substrate and the second substrate are coupled such that the plurality of high electron mobility transistors provides the output signal via at least one of the first level interconnects or the second level interconnects.

2. The system of claim 1, wherein each electrical path length of a plurality of given electrical path lengths between the input and the output through respective high electron mobility transistors is a same path length.

3. The system of claim 1, wherein the plurality of high electron mobility transistors is disposed in a distributed spatial arrangement, wherein a portion of the distributed spatial arrangement comprises an array, wherein the array comprises at least one of: a rectangular array, a hexagonal array, or a radial array.

4. The system of claim 1, wherein the plurality of high electron mobility transistors comprises gallium nitride (GaN) transistors.

5. The system of claim 1, wherein the first substrate comprises an epitaxial GaN-compatible substrate, and wherein the second substrate comprises silicon.

6. The system of claim 1, wherein the plurality of high electron mobility transistors comprises a first amplifier stage, wherein the first amplifier stage comprises a plurality of first stage transistor circuits, wherein the input signal is coupled among the first stage transistor circuits via a second level interconnect, wherein a given electrical path length along the second level interconnect is equal between the input and respective endpoints of the second level interconnect.

7. The system of claim 6, wherein the plurality of high electron mobility transistors further comprises a second amplifier stage, wherein the second amplifier stage comprises a plurality of second stage transistor circuits, wherein respective outputs of the first stage transistor circuits are coupled among second stage transistor circuits via respective first or second level interconnects, wherein a given electrical path length along the respective first or second level interconnects is equal between the respective outputs of the first stage transistor circuits and respective endpoints of the first or second level interconnects.

8. The system of claim 7, wherein the plurality of high electron mobility transistors further comprises a third amplifier stage, wherein the third amplifier stage comprises a plurality of third stage transistor circuits, wherein respective outputs of the second stage transistor circuits are coupled among the third stage transistor circuits via respective first or second level interconnects, wherein a given electrical path length along the respective first or second level interconnects is equal between the respective outputs of the second stage transistor circuits and respective endpoints of the first or second level interconnects.

9. The system of claim 8, wherein respective outputs of the third stage transistor circuits are coupled to the output via the first or second level interconnects, wherein a given electrical path length along the first or second level interconnect is equal among the respective outputs of the final stage transistor circuits and the output.

10. The system of claim 1, wherein the plurality of high electron mobility transistors comprises a first amplifier stage, a second amplifier stage, and a third amplifier stage.

11. The system of claim 1, wherein the second portion of the plurality of high electron mobility transistors are electrically coupled to the second level interconnects via a plurality of inter-level columns disposed between the first substrate and the second substrate, and wherein the plurality of inter-level columns comprise at least one of: gold, tin, indium, copper, or aluminum.

12. The system of claim 1, wherein the input signal comprises a microwave signal, wherein the microwave signal comprises at least one frequency within a frequency range between 26.5 GHz and 40 GHz.

13. The system of claim 1, wherein the first level interconnects comprise microstrip conductors, and wherein the second level interconnects comprise stripline conductors.

14. The system of claim 1, further comprising a passive component disposed on the second substrate, and wherein the passive component comprises a capacitor, an inductor, or a resistor.

15. The system of claim 1, wherein the second substrate comprises a first surface facing the first substrate and a second surface opposite the first surface, wherein the second level interconnects are disposed along the first surface of the second substrate, wherein the output is disposed along the second surface of the second substrate, and wherein the output is coupled to the plurality of high electron mobility transistors by a through-wafer via.

16. The system of claim 1, further comprising mixed signal circuitry, wherein at least a portion of the mixed signal circuitry is disposed along a surface of the second substrate, and wherein the portion of the mixed signal circuitry is coupled to the plurality of high electron mobility transistors by a plurality of inter-level columns.

17. A system comprising:
a plurality of high electron mobility transistors disposed on a first substrate, wherein the plurality of high electron mobility transistors is configured to accept an input signal from an input and provide an output signal at an output, wherein the output signal comprises an amplified version of the input signal, wherein a first portion of the plurality of high electron mobility transistors are electrically coupled via respective first level interconnects disposed on the first substrate; and
a plurality of second level interconnects disposed on a second substrate, wherein a second portion of the plurality of high electron mobility transistors are electrically coupled via respective second level interconnects, wherein the first substrate and the second substrate are coupled such that the plurality of high electron mobility transistors provides the output signal via at least one of the first level interconnects or the second level interconnects, wherein the first substrate and the second substrate comprise dissimilar materials, wherein the plurality of high electron mobility transistors comprises a plurality of amplifier stages, wherein the first level interconnects comprise microstrip conductors, wherein the second level interconnects comprise stripline conductors, wherein the input signal comprises a microwave signal, wherein the microwave signal comprises at least one frequency within a frequency range between 26.5 GHz and 40 GHz, and wherein the system dissipates at least 20 watts of electrical power.

18. The system of claim 17, wherein each electrical path length of a plurality of given electrical path lengths between the input and the output through respective high electron mobility transistors is a same path length.

19. A method comprising,
determining a distributed spatial arrangement of a plurality of high electron mobility transistors disposed on a first substrate, wherein the plurality of high electron mobility transistors comprises gallium nitride (GaN) transistors, wherein the plurality of high electron mobility transistors is configured to accept an input signal from an input and provide an output signal at an output, wherein the output signal comprises an amplified version of the input signal;
determining an arrangement of first level interconnects disposed on the first substrate, wherein a first portion of the plurality of high electron mobility transistors are electrically coupled via respective first level interconnects;
determining an arrangement of a plurality of second level interconnects disposed on a second substrate;
coupling the first substrate and the second substrate such that a second portion of the plurality of high electron mobility transistors are electrically coupled via respective second level interconnects, wherein the first substrate and the second substrate comprise different materials, wherein the first substrate comprises an epitaxial GaN-compatible substrate, and wherein the second substrate comprises silicon; and
operating the plurality of high electron mobility transistors such that the plurality of high electron mobility transistors provides the output signal via at least one of the first level interconnects or the second level interconnects.

20. The method of claim 19, wherein each electrical path length of a plurality of given electrical path lengths between the input and the output through respective high electron mobility transistors is a same path length.

21. A system comprising:
a plurality of high electron mobility transistors disposed on a first substrate, wherein the plurality of high electron mobility transistors is configured to accept an input signal from an input and provide an output signal at an output, wherein the output signal comprises an amplified version of the input signal, wherein a first portion of the plurality of high electron mobility transistors are electrically coupled via respective first level interconnects disposed on the first substrate; and
a plurality of second level interconnects disposed on a second substrate, wherein a second portion of the plurality of high electron mobility transistors are electrically coupled via respective second level interconnects, wherein the first substrate and the second substrate are coupled such that the plurality of high electron mobility transistors provides the output signal via at least one of the first level interconnects or the second level interconnects, wherein each electrical path length of a plurality of given electrical path lengths between the input and the output through respective high electron mobility transistors is a same path length, wherein the same path length is selected so as to maintain phase coherence between the plurality of given electrical path lengths between the input and the output, wherein the respective first level interconnects comprise respective portions of at least two electrical path lengths of the plurality of electrical path lengths.

\* \* \* \* \*